US012027637B2

United States Patent
Strahm et al.

(10) Patent No.: US 12,027,637 B2
(45) Date of Patent: Jul. 2, 2024

(54) SOLAR CELL STRING FOR USE IN A PHOTOVOLTAIC MODULE

(71) Applicant: MEYER BURGER (SWITZERLAND) AG, Thun (CH)

(72) Inventors: Benjamin Strahm, Giez (CH); Pierre Papet, Hauterive (CH); Rainer Grischke, Sugiez (CH); Walter Frammelsberger, Neuchatel (CH)

(73) Assignee: MEYER BURGER (SWITZERLAND) AG, Thun (CH)

( * ) Notice: Subject to any disclaimer, the term of this patent is extended or adjusted under 35 U.S.C. 154(b) by 58 days.

(21) Appl. No.: 17/997,454

(22) PCT Filed: Apr. 27, 2021

(86) PCT No.: PCT/EP2021/060925
§ 371 (c)(1),
(2) Date: Oct. 28, 2022

(87) PCT Pub. No.: WO2021/219599
PCT Pub. Date: Nov. 4, 2021

(65) Prior Publication Data
US 2023/0223488 A1 Jul. 13, 2023

(30) Foreign Application Priority Data
Apr. 29, 2020 (EP) .................... 20172072

(51) Int. Cl.
*H01L 31/05* (2014.01)
(52) U.S. Cl.
CPC ...... *H01L 31/0508* (2013.01); *H01L 31/0512* (2013.01)
(58) Field of Classification Search
CPC .................... H01L 31/0508; H01L 31/0504
See application file for complete search history.

(56) References Cited

U.S. PATENT DOCUMENTS

| 7,432,438 B2 | 10/2008 | Rubin et al. |
| 2008/0223429 A1* | 9/2008 | Everett ............... H01L 31/0516 136/246 |

(Continued)

FOREIGN PATENT DOCUMENTS

| CN | 208271927 U | 12/2018 |
| WO | 2019016118 A1 | 1/2019 |

OTHER PUBLICATIONS

International Search Report and Written Opinion for PCT/EP2021/060925 Dated Jul. 8, 2021.

(Continued)

*Primary Examiner* — Angelo Trivisonno
(74) *Attorney, Agent, or Firm* — Bryan D. Zerhusen; Nicholas R. Herrel; CANTOR COLBURN LLP

(57) ABSTRACT

The present invention is directed to solar cell strings (1) for photovoltaic modules comprising (i) a string of solar cells (2a, 2b, 2c) facing each other in opposite polarity and shingled in string direction with or without partial overlap of solar cells (2a, 2b, 2c); (ii) at least one elongated electrically conducting interconnect (3a, 3b) extending in string direction from one side of one solar cell to the opposite side of the next solar cell (2a, 2b, 2c) for mechanically and electrically connecting the positive and negative electrodes of the shingled solar cells (2a, 2b, 2c) in string direction on the alternating top and bottom sides of the solar cells, and (iii) at least two adhesives, optionally thermoadhesive foils (4a, 4b) covering the at least one elongated interconnect (3a, 3b) and at least part of the top or bottom side of each solar cell that comprises the elongated interconnect, with the proviso that (a) there is no horizontal gap between shingled solar cells, (b) the adhesives (4a, 4b) do not contact each other, do not extend beyond one solar cell, do not extend into the optional partial overlap of solar cells (2a, 2b, 2c), and at least (Continued)

Figure 1:
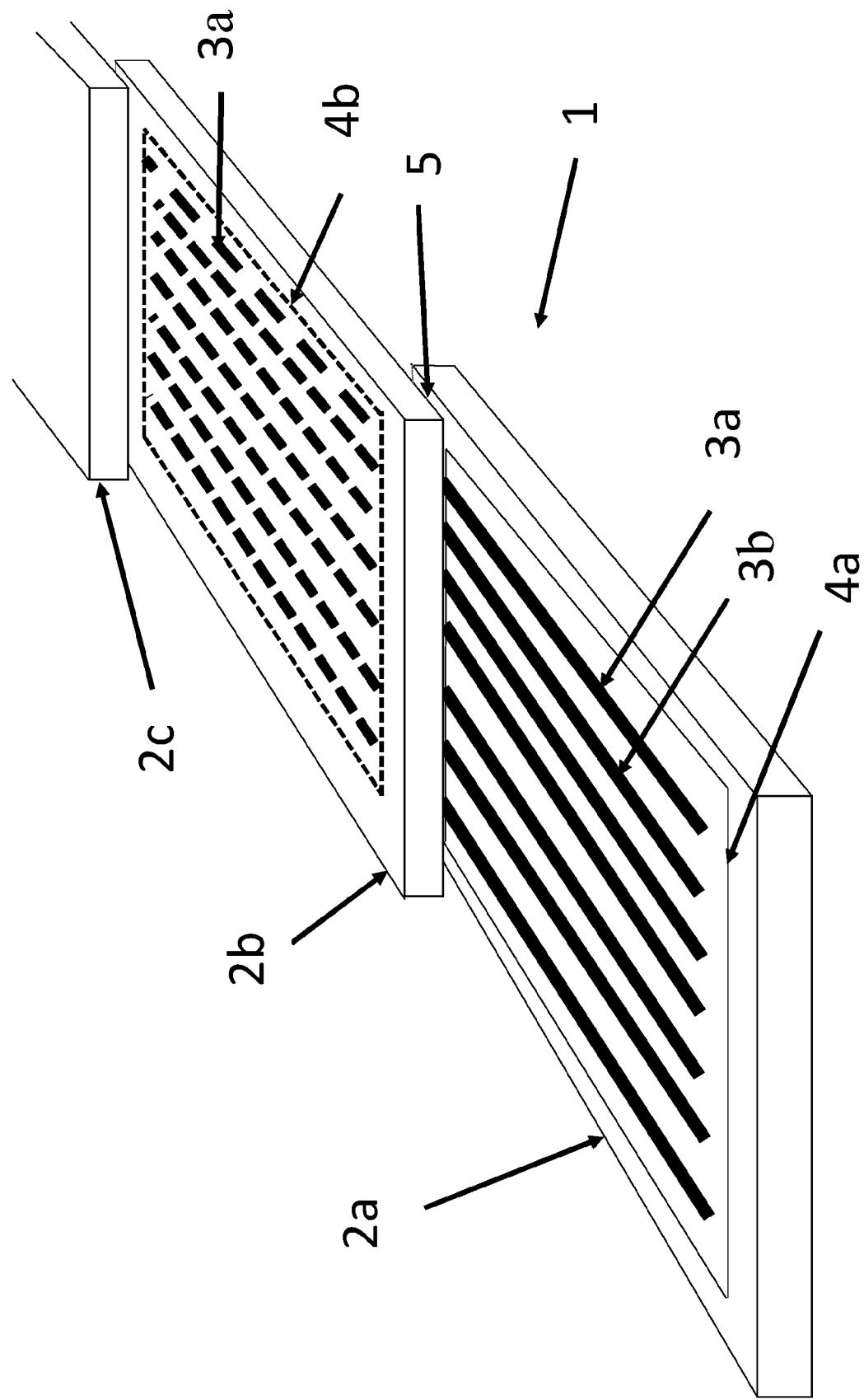

partially cover and mechanically fixate the at least one interconnect (3a, 3b) to the solar cells (2a, 2b, 2c).

17 Claims, 2 Drawing Sheets

(56) References Cited

U.S. PATENT DOCUMENTS

| | | | | |
|---|---|---|---|---|
| 2010/0258161 | A1* | 10/2010 | Weber | H01L 31/068 |
| | | | | 136/246 |
| 2012/0325282 | A1 | 12/2012 | Snow et al. | |
| 2014/0345675 | A1* | 11/2014 | Clark | H01L 31/0512 |
| | | | | 136/251 |

OTHER PUBLICATIONS

Schulte-Huxel Henning et al: "Interconnect-shingling: Maximizing the ctive module area with conventional module processes", Solar Energy Materials and Solar Cells, Elsevier Science Publishers, Amsterdam, Nl, vol. 200, Jun. 22, 2019 (Jun. 22, 2019), XP085797523.

* cited by examiner

SOLAR CELL STRING FOR USE IN A PHOTOVOLTAIC MODULE

The present application is a National Stage Entry of PCT/EP2021/060925, filed 27 Apr. 2021, published as WO 2021/219599 A1, which claims the benefit of and priority to European Patent Application Number 20172072.9, filed 29 Apr. 2020 and titled IMPROVED SOLAR CELL STRING FOR USE IN A PHOTOVOLTAIC MODULE, each of which is incorporated herein by reference in its entirety.

The present invention is directed to solar cell strings (1) for photovoltaic modules comprising (i) a string of solar cells (2a, 2b, 2c) facing each other in opposite polarity and shingled in string direction with or without partial overlap of solar cells (2a, 2b, 2c); (ii) at least one elongated electrically conducting interconnect (3a, 3b) extending in string direction from one side of one solar cell to the opposite side of the next solar cell (2a, 2b, 2c) for mechanically and electrically connecting the positive and negative electrodes of the shingled solar cells (2a, 2b, 2c) in string direction on the alternating top and bottom sides of the solar cells, and (iii) at least two adhesives, optionally thermoadhesive foils (4a, 4b) covering the at least one elongated interconnect (3a, 3b) and at least part of the top or bottom side of each solar cell that comprises the elongated interconnect, with the proviso that (a) there is no horizontal gap between shingled solar cells, (b) the adhesives (4a, 4b) do not contact each other, do not extend beyond one solar cell, do not extend into the optional partial overlap of solar cells (2a, 2b, 2c), and at least partially cover and mechanically fixate the at least one interconnect (3a, 3b) to the solar cells (2a, 2b, 2c).

Typically, a photovoltaic module is assembled from a number of individually produced and separately transported solar cell strings, i.e. solar panels, and the strings are arranged side by side to form one large flat body. The solar cells of the string are electrically interconnected by wires or ribbons that connect the electrode side of one cell with the electrode side of the adjacent cell, thus allowing for current flow in string direction. Solar strings with solar cells arranged in parallel regularly feature a front-front configuration, where all front sides of the cells have the same electrode charge and the wire or ribbon will connect the front electrode of one cell with the rear electrode of opposite charge of the adjacent cell.

Most common interconnection schemes feature a certain gap between neighboring cells to enable the guidance of an interconnector from the top side of one cell to the bottom side of the connected cell.

In an alternative way the solar cells can be connected by a slight overlap and by thus allowing direct conductive contact of adjacent cells.

Overlapping shingled solar cell strings do not need conventional wire or ribbon interconnectors because of the close proximity of oppositely charges cell electrodes. Mechanical and conductive contact is routinely achieved by adding low resistance electrically conductive interconnect materials such as conductive adhesive alloys. The metallization interconnect is often rather thick to improve current flow. Since the gap for electrical insulation between front-front-arranged solar cells is no longer required, the shingled front-rear-arranged solar cells and the solar cell string can be dimensioned smaller giving the opportunity to achieve higher module efficiencies However, mechanical stress on the interconnect in the overlap of shingled solar cells has the potential for (micro) cracks, possibly leading to reduced current flow or even short-circuiting of the electrons due to thermo-mechanical stress. A further disadvantage of solar cell shingling with direct contact in the overlapping zone is the relatively large overlap, necessary to guarantee a good contact and hence that the overlap part is no longer available for current formation.

WO2019/016118A1 discloses solar cell strings comprising (i) a string of solar cells shingled in string direction resulting in positive and negative electrode overlap, (ii) an interconnect for electrically connecting the positive and negative electrodes of the shingled solar cells, and (iii) an adhesive foil spanning at least part of the string and positioned on (a) the top (sun facing) sides of the at least two shingled solar cells, and/or (b) the bottom (far) sides of the at least two shingled solar cells, or on (c) the top side of one solar cell and on the bottom side of the overlapping solar cell, in which case the adhesive foil comprises the interconnect and connects the overlap in order to mechanically connect and position the shingled solar cells.

U.S. Pat. No. 7,432,438 B2 relates to an electrode for contacting an electrically conductive surface of a photovoltaic element, the electrode comprising an electrically insulating optically transparent film, an adhesive layer provided on a planar surface of the film, and a plurality of substantially parallel, electrically conducive wires embedded into the adhesive layer, wherein the wires lie over the planar surface of the film, and the adhesive layer has a thickness less than the thickness of the wires embedded therein, wherein part of the surfaces of the wires protrudes from the adhesive layer and at least part of the surfaces are covered by a coating consisting of an alloy having a low melting point, to facilitate soldering the wires to the electrically conductive surface and to a first terminal bar.

It is the objective of the present invention to provide conductively efficient and mechanically stable solar cell strings for use in the assembly of photovoltaic modules, in particular conductively efficient and mechanically stable shingled solar cell strings.

In a first aspect of the invention the objective is solved by a solar cell string (1) for use in a photovoltaic module comprising (i) a string of at least two solar cells (2a, 2b, 2c)—facing each other in opposite polarity, and shingled in string direction with or without partial overlap of solar cells (2a, 2b, 2c);

(ii) at least one elongated electrically conducting interconnect (3a, 3b), optionally wire, ribbon or busbar, extending in string direction from one side of one solar cell to the opposite side of the next solar cell (2a, 2b, 2c) for mechanically and electrically connecting the positive and negative electrodes of the shingled solar cells (2a, 2b, 2c) in string direction on the alternating top and bottom sides of the solar cells, and (iii) at least two adhesives (4a, 4b), optionally thermoadhesive foils, covering the at least one elongated interconnect (3a, 3b) and at least part of the top or bottom side of each solar cell that comprises the elongated interconnect;

with the proviso that (a) there is no horizontal gap between shingled solar cells, (b) the adhesives (4a, 4b) do not contact each other, do not extend beyond one solar cell, do not extend into the optional partial overlap of solar cells (2a, 2b, 2c), and at least partially cover and mechanically fixate the at least one interconnect (3a, 3b) to the solar cells (2a, 2b, 2c).

The term "solar cell string", as defined herein, encompasses all mechanical and conductive arrangements of more than one solar cell that generates and transports a photovoltaically generated current along adjacently positioned solar cells in string direction, i.e. in the direction of current flow from the solar cell on one end to the solar cell on the opposite end.

The solar cell strings of the present invention are for use in a photovoltaic module, i.e. for assembling and forming part of a functional photovoltaic module. Optionally, the solar cells for use in the present invention are conventional, e.g. with a semiconductor material positioned between top and bottom surfaces, e.g. anode and cathode materials, i.e. positive and negative electrodes, that may, for example, be formed by metallization or a transparent conductive coating, e.g. a transparent film coating.

The term "shingled in string direction", as used herein, is meant to indicate that consecutive, i.e. neighboring solar cells are vertically offset in string direction. In a string of solar cells arranged according to the present invention the solar cells are shingled with or without overlap, meaning that consecutive solar cells partially cover each other, i.e. the upper cell partially shades the vertically offset lower solar cell, or alternatively, the consecutive solar cells are offset vertically but do not form a horizontal gap.

The overlapped edge region of the vertically offset lower solar cell is optionally minimized to avoid loss of photovoltaic activity due to shading in the resulting solar module.

The solar cell string of the invention comprises at least one elongated electrically conducting interconnect (3a, 3b), optionally a wire or busbar, extending in string direction from one side of one solar cell to the opposite side of the next solar cell (2a, 2b, 2c) for mechanically and electrically connecting the positive and negative electrodes of the shingled solar cells (2a, 2b, 2c) in string direction on the alternating top and bottom sides of the solar cells.

In one alternative embodiment of the present invention the solar cell string (1) of the present invention is one, wherein the shingled solar cells overlap at least partially and the interconnect (3a, 3b) is not fixated to at least one or both of the solar cells in the overlap region. This alternative has the advantage that the shingled solar cell string maintains some additional mechanical flexibility in the overlap region.

In another alternative embodiment the shingled solar cells do not overlap in the solar cell string.

In the string of the present invention the interconnect for mechanically and electrically connecting the electrodes of the shingled solar cells may be any material serving said function. For example, the at least one elongated interconnect (3a, 3b), optionally a wire, ribbon or bus bar, may further connect all contact structures, optionally contact fingers on each solar cell.

In one optional embodiment the solar cell string (1) of the present invention is one, wherein the height or diameter of the at least one elongated interconnect (3a, 3b) determines the minimum vertical offset (5), optionally gap (5) of neighboring solar cells in the solar cell string (1). In other words, the consecutive neighboring solar cells are vertically separated and mechanically connected only by the interconnect and the mechanical flexibility of interconnect essentially determines the flexibility of the solar cell string.

For example, the at least one interconnect (3a, 3b) is selected from the group consisting of bus bars, ribbons and metal wires, optionally metal wires coated with solderable material, optionally with Ag—, Cu—, Bi—, In—, Pb—, Sn— and combinations thereof—comprising solder, optionally SnBi— or In-comprising solder. In one non-limiting embodiment, the interconnect (3a, 3b) mechanically and electrically may contact a conductive layer on the solar cell.

The solar cell string of the present invention comprises at least two adhesives (4a, 4b), optionally thermoadhesive foils, covering the at least one elongated interconnect (3a, 3b) and at least part of the top or bottom side of each solar cell that comprises the elongated interconnect.

It is common general understanding that adhesives for use on the top side of a solar cell, i.e. directed towards the sun, must be transparent for the sun light to initiate and continue the photovoltaic process in the solar cell. Adhesives may not be transparent if they do not substantially prevent sun light from reaching the photovoltaically active top side or if they are located on the bottom, i.e. the shaded side, of a solar cell.

The adhesives (4a, 4b), for example, adhesive foils, optionally thermoadhesive foils are or comprise a polymer foil, optionally selected from the group consisting of duroplasts, optionally EVAs (ethylene vinyl acetates), TPSEs (thermoplastic silicone elastomers), TPUs (thermoplastic polyurethanes), PETs (polyethylene terephthalates), TPOs (thermoplastic polyolefin elastomers), ionomers, thermoplasts; optionally PVBs (polyvinylbutyrals), silicones, polyolefins (PO), PPs (polypropylenes), ionomers; and combinations of thermoduoplasts, optionally a polymer foil thermoadhesive at temperatures in the range of 50 to 250° C., optionally in the range of 60 to 200° C., optionally in the range of 75 to 175° C.

The solar cell strings of the present invention are unique in that (a) there is no horizontal gap between shingled solar cells, i.e. the solar cells overlap partially or the horizontal distance among neighboring cells, i.e. the gap (5), is zero; (b) the adhesives (4a, 4b) do not contact each other, do not extend beyond one solar cell, do not extend into the optional partial overlap of solar cells (2a, 2b, 2c), and at least partially cover and mechanically fixate the at least one interconnect (3a, 3b) to the solar cells (2a, 2b, 2c).

The solar cell strings and their embodiments as described herein have a number of advantages. For example, adhesives, in particular adhesive foils, only fixate interconnects/wires on each solar cell and do not extend to the next solar cell. Therefore, mechanical stability, limited flexibility and connectivity is provided essentially only by the solar cell-connecting interconnects and these interconnects do not span any horizontal gap between consecutive solar cells, thus avoiding mechanical stress when overly bending the interconnect between solar cells, but allowing for some limited mechanical flexibility, of course depending on the flexibility of the interconnect material used and its dimensions and shape, e.g. wire- or ribbon-shaped.

Optionally, the adhesives, e.g. thermoadhesive foils, do not extend into the partial overlap zone of consecutive solar cells.

In another embodiment of the present invention, the interconnects in the overlap region of consecutive solar cells in the string are not electrically or mechanically connected, e.g. soldered, to the solar cells, thus saving expensive connecting materials, e.g. solder paste, e.g. silver-comprising solder paste.

And, for the alternative, where no adhesive, e.g. thermoadhesive foil, extends into the partial overlap zone of two consecutive solar cells in the string, there will be less stress during the adhesive lamination, resulting in improved process yield, and the lack of adhesive foil will reduce bending stress on the interconnectors after lamination.

The solar cell strings of the present invention are generally more flexible but also resilient to mechanical stress, e.g. during transport, weather impact, etc., and they allow for easy and economical production because, for example, the interconnects, e.g. wires, can be positioned and fixed to the adhesives, e.g. foils, first, followed by positioning and fixing of solar cells in shingling arrangement. Alternatively, the interconnects, e.g. wires, can be positioned and fixed to the consecutive solar cells first, followed by positioning and fixing of adhesive foils.

Further aspects of the present invention relate to a method for producing the solar cell string as described herein, and to a photovoltaic module comprising the solar cell string.

In the following the present invention will be illustrated by representative examples and figures, none of which are to be interpreted as limiting the scope of the present invention beyond the appended claims.

LIST OF REFERENCE SIGNS (1) solar cell string
(2) (2a, 2b, 2c) solar cells
(3a, 3b) electrically conducting interconnect
(4a, 4b) adhesives (optionally thermoadhesive foils)
(5) vertical offset (gap) of neighboring solar cells in solar cell string

FIGURES

FIG. 1 schematically shows a shingled solar cell string 1 with three consecutive solar cells 2a, 2b, 2c with partial overlap at the ends for use in the assembly of a photovoltaic module according to the present invention. The interconnects 3a, 3b can be implemented, for example, as bus bars, ribbons and metal wires, optionally metal wires coated with solderable material, e.g. as described herein. The dashed lines indicate that the structure is located beneath a solar cell. For example, interconnects 3a are located on top of solar cell 2a (sun-directed) and continue as interconnects 3b when located beneath solar cell (2b) (shaded). Adhesive foil 4a is transparent, whereas adhesive foil 4b may optionally not be transparent as it is shaded in operational use anyhow. Adhesive foil 4a attaches the interconnects 3a to the top side of solar cell 2a and extends very little into the partial overlap 5 of solar cells 2a and 2b. Hence, the adhesive foil 4a contributes to the minimum vertical offset together with the height or diameter of the interconnects 3a. In an alternative embodiment, the adhesive 4a does not extend into the overlap 5 and the vertical offset is determined by the height or diameter of the interconnects 3a only. Adhesive foil 4b attaches, i.e. fixates, the interconnects 3b to the bottom side of solar cell 2b and may optionally extend into the partial overlap 5 of solar cells 2a and 2b or not. Optionally, the interconnects 3a, 3b may not be attached, i.e. fixated, to solar cells 2a, 2b in the overlap area 5 and may allow for limited mechanical flexibility, e.g. bending, depending on the shape, material properties and pliability of the interconnects 3a, 3b.

Figure 2:
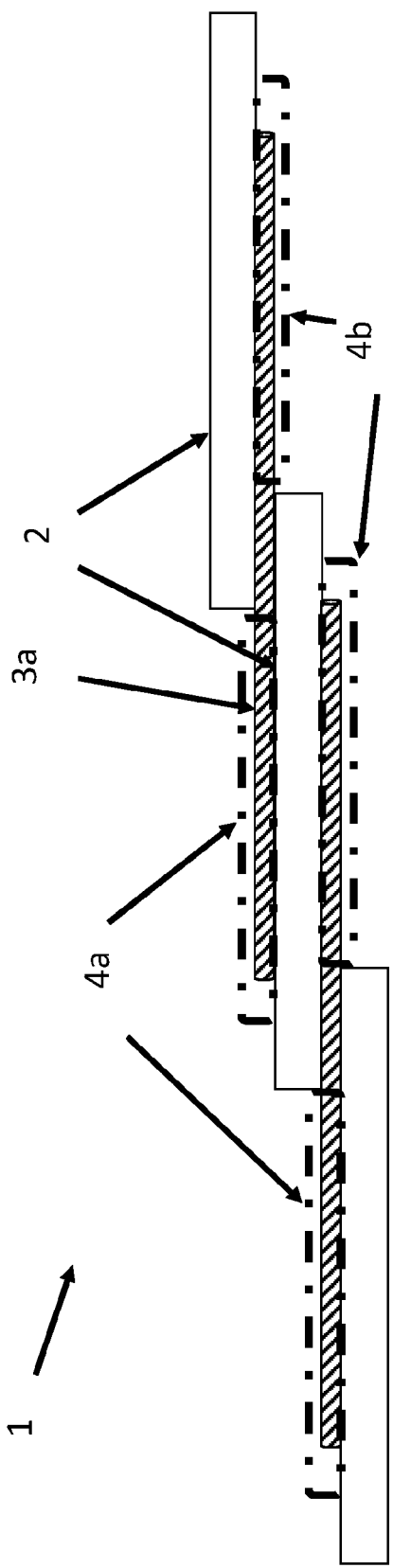

FIG. 2 is a side view of an embodiment of the solar cell string of FIG. 1, wherein the adhesives 4a, 4b, e.g. thermoadhesive foils, attach the interconnects 3a, 3b to solar cells 2 but do not extend into the overlap area, and wherein the vertical offset of the solar cells is essentially determined by the height or diameter of the interconnects 3a, 3b.

Figure 3:
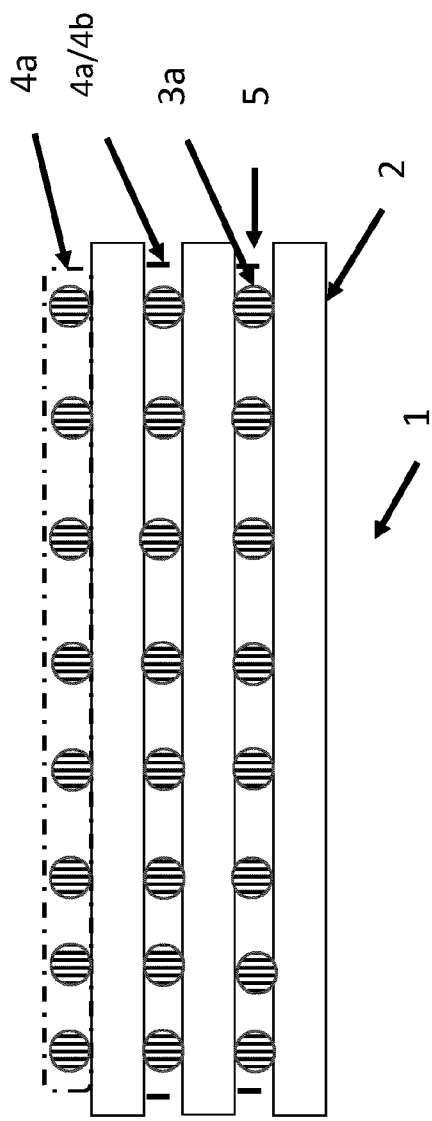

FIG. 3 is a side view of the solar cell string of FIG. 2 with the option of wire-shaped interconnects 3a, 3b, wherein the vertical offset of the solar cells 2 is determined essentially by the diameter of the interconnects 3a, 3b, and the adhesive foils 4a, 4b do not extend into the overlap region of the solar cells 2.

The invention claimed is:

1. A solar cell string comprising
   (i) a string of at least two solar cells facing each other in opposite polarity, and shingled in string direction with or without partial overlap of solar cells;
   (ii) at least one elongated electrically conducting interconnect extending in string direction from one side of one solar cell to the opposite side of the next solar cell for mechanically and electrically connecting the positive and negative electrodes of the shingled solar cells in string direction on the alternating top and bottom sides of the solar cells; and
   (iii) at least two adhesives covering the at least one elongated interconnect and at least part of the top or bottom side of each solar cell that comprises the elongated interconnect;
   with the proviso that (a) there is no horizontal gap between shingled solar cells, (b) the adhesives do not contact each other, do not extend beyond one solar cell, do not extend into the optional partial overlap of solar cells and at least partially cover and mechanically fixate the at least one interconnect to the solar cells.

2. The solar cell string of claim 1, wherein the shingled solar cells overlap at least partially producing an overlap region and the interconnect is not fixated to at least one or both of the solar cells in the overlap region.

3. The solar cell string of claim 1, wherein the shingled solar cells do not overlap.

4. The solar cell string of claim 1, wherein the at least one elongated interconnect further connects all of the at least two solar cells.

5. The solar cell string of claim 1, wherein the height or diameter of the at least one elongated interconnect determines the minimum vertical offset of neighboring solar cells in the solar cell string.

6. The solar cell string of claim 1, wherein the at least one interconnect is selected from the group consisting of bus bars, ribbons, and metal wires.

7. The solar cell string of claim 1, wherein the at least one elongated electrically conducting interconnect mechanically and electrically contacts a conductive layer on the solar cell.

8. The solar cell string of claim 1, wherein the adhesive foils comprise a polymer foil.

9. A photovoltaic module comprising a solar cell string according to claim 1.

10. The solar cell string of claim 6, wherein the at least one interconnect is selected from metal wires coated with solderable material.

11. The solar cell string of claim 10, wherein the solderable material comprises Ag—, Cu—, Bi—, In—, Pb—, Sn— and combinations thereof.

12. The solar cell string of claim 8, wherein the polymer foils comprise a duroplast, thermoplast, thermoduroplast, or a combination thereof.

13. The solar cell string of claim 8, wherein the polymer foils comprise ethylene vinyl acetates (EVAs), thermoplastic silicone elastomers (TPSEs), thermoplastic polyurethanes (TPUs), polyethylene terephthalates (PETs), thermoplastic polyfin elastomers (TPOs), ionomers, thermoplasts, PVBs (polyvinylbutyrals (PVBs), silicones, polyolefins (PO), or polypropylenes (PPs).

14. The solar cell string of claim 8, wherein the polymer foils comprise a polymer foil thermoadhesive at temperatures in the range of 50 to 250° C.

15. The solar cell string of claim 8, wherein the polymer foils comprise a polymer foil thermoadhesive at temperatures in the range of 60 to 200° C.

16. The solar cell string of claim 8, wherein the polymer foils comprise a polymer foil thermoadhesive at temperatures in the range of 75 to 175° C.

17. A photovoltaic module comprising a solar cell string according to claim 2.

\* \* \* \* \*